United States Patent [19]

Yasuzato

[11] Patent Number: 5,619,304

[45] Date of Patent: Apr. 8, 1997

[54] REDUCTION EXPOSURE APPARATUS WITH IMPROVED RESOLUTION CHARACTERISTIC AND RAISED LIGHT INTENSITY

[75] Inventor: Tadao Yasuzato, Tokyo, Japan

[73] Assignee: NEC Corporation, Japan

[21] Appl. No.: 346,522

[22] Filed: Nov. 29, 1994

[30] Foreign Application Priority Data

Nov. 30, 1993 [JP] Japan .................................. 5-323338

[51] Int. Cl.⁶ ................. G03B 27/72; G03F 7/20
[52] U.S. Cl. ................................. 355/71; 355/67
[58] Field of Search .................... 355/53, 71, 67, 355/52, 55

[56] References Cited

U.S. PATENT DOCUMENTS

| | | | |
|---|---|---|---|
| 4,939,630 | 7/1990 | Kikuchi et al. | 362/268 |
| 5,335,044 | 8/1994 | Shiraishi | 355/53 |
| 5,387,961 | 2/1995 | Kang | 355/71 |
| 5,436,761 | 7/1995 | Kamon | 359/487 |

FOREIGN PATENT DOCUMENTS 61-91662  5/1986  Japan ........................... G03F 7/20

*Primary Examiner*—Arthur T. Grimley
*Assistant Examiner*—Herbert V. Kerner
*Attorney, Agent, or Firm*—Hayes, Soloway, Hennessey, Grossman & Hage, P.C.

[57] ABSTRACT

Rays of light from a super-high pressure mercury lamp are collected by an oval mirror, reflected by a cold mirror and additionally rendered parallel. The parallel light is passed through an interference filter and enters as incident light to individual lens units of a fly-eye lens. The individual lens units improve uniformity of intensity distribution and coherency of the light and act as isolated light sources. Right after the fly-eye lens is placed an aperture member that determines the form of an effective light source. The light passes through the aperture member, a cold mirror and a condenser lens to illuminate a reticle. A pattern of the reticle is projected on a semiconductor substrate coated with a photosensitive resin, by a projection lens system. The resolution property and exposure intensity of a reduction exposure apparatus is improved and aperture member positioning is facilitated. The throughput of the system can also be improved.

9 Claims, 9 Drawing Sheets

LIGHT
INTENSITY

FIG. 8
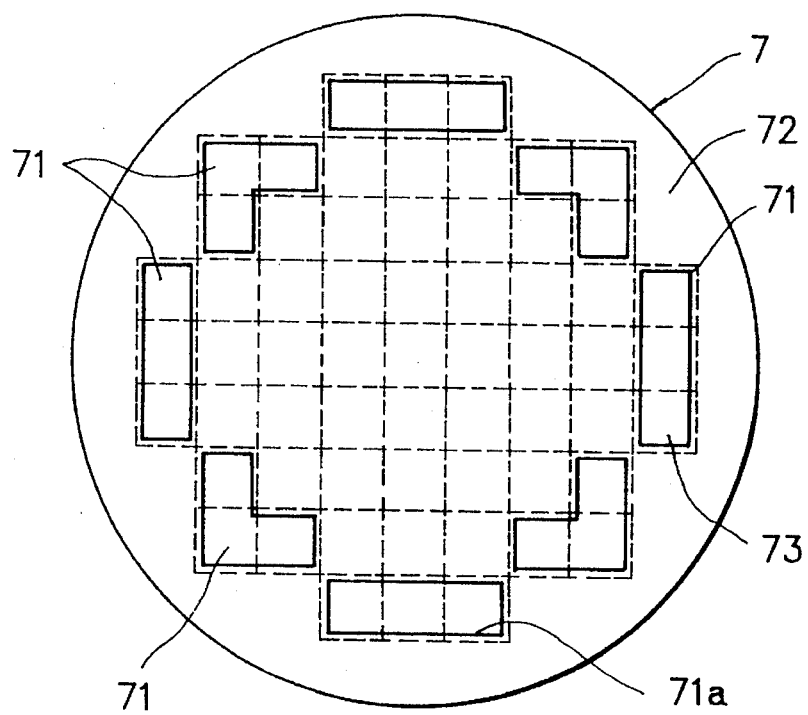
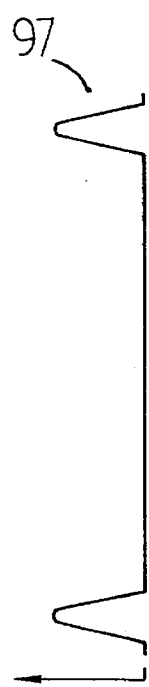
FIG. 9D
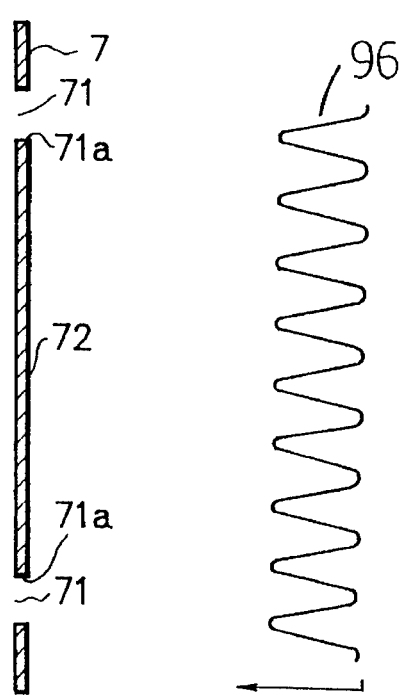
FIG. 9C
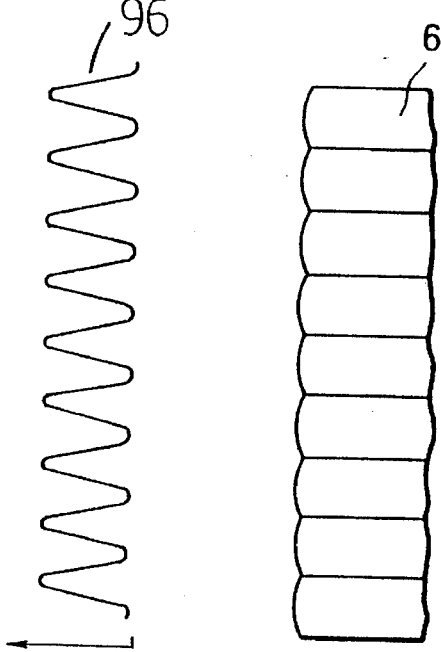
FIG. 9B
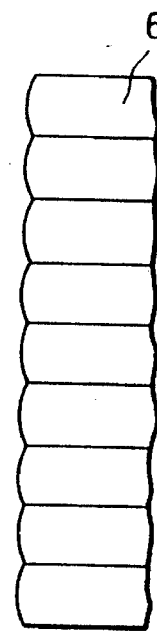
FIG. 9A F I G. 17
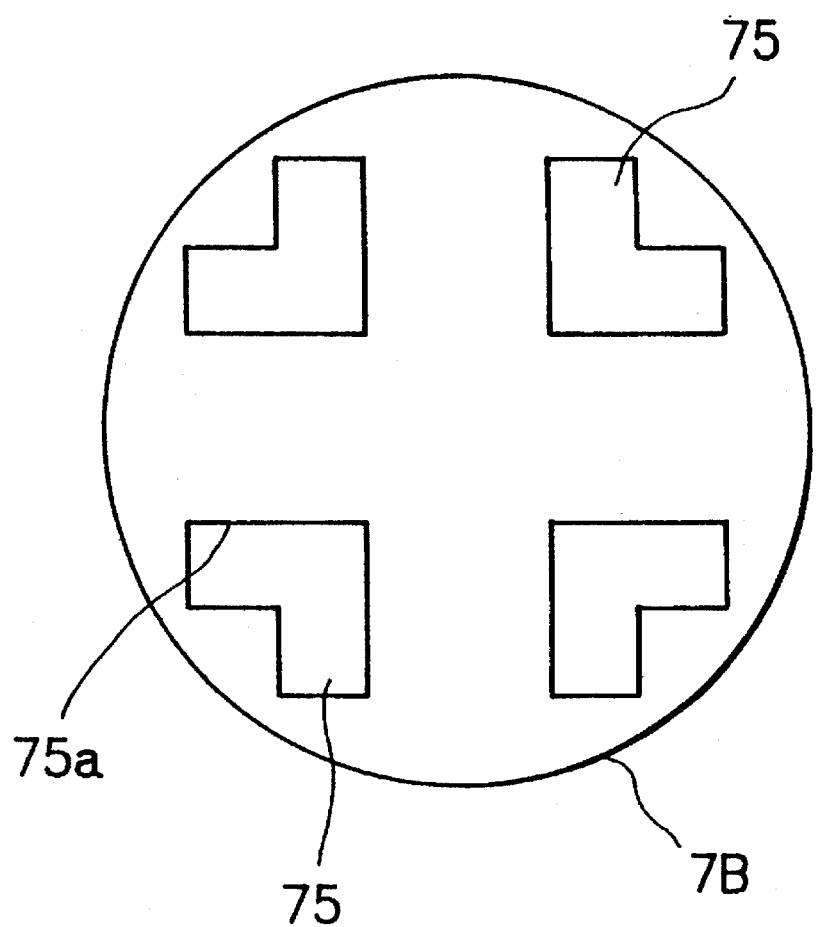

REDUCTION EXPOSURE APPARATUS WITH IMPROVED RESOLUTION CHARACTERISTIC AND RAISED LIGHT INTENSITY

BACKGROUND OF THE INVENTION

The present invention relates to a reduction exposure apparatus for use in producing semiconductor devices, and more particularly, to a reduction exposure apparatus in which a light from an effective light source or a fly-eye lens in narrowed down by an aperture stop to illuminate a reticle.

DESCRIPTION OF THE RELATED ART

In the prior art a reduction exposure apparatus has been and is used for producing semiconductor devices or the like. The production of semiconductor devices includes a lithography process to which an optical lithography technique is mainly applied. A reduction exposure apparatus is employed for the optical lithography, in which generally an optical NA (numerical aperture) of a projection lens in the exposure system is increased to be high, permitting even a mass production of a semiconductor device with a minimum line width not exceeding 0.5 μm. A high optical NA of the lens provides an advatageously increased resolution, with a concurrent tendency to disadvantageously reduce the depth of focus. The depth of focus moves in the reducing direction. For a desirable formation hereafter of fine patterns with a minimum line width not exceeding 0.85 μm, it may thus be difficult to maintain stable mass production by simply increasing an optical NA of projection lens as described. For such reasons, attention has been directed to adapting an illumination system for an improved resolution performmance, in particular for use with a deformed aperture illumination method. An example of this method has been proposed in Japanese Patent Laid-Open Publication No. 86-91662.

As an introduction to the deformed aperture illumination method, reference will now be made to a prior art illumination system, as shown in FIG. 1. Referring to FIG. 1, the illumination system includes a fly-eye lens 16 composed of a plurality of individual lenses 161 arranged in parallel to each other to thereby provide an effective light source having a group of point light sources working with a supplied beam of light from an unshown light source. Right after the fly-eye lens 16 is placed an aperture member (aperture step) 17c formed with an opening for transmitting light therethrough to illuminate a reticle 110 of which a reticle pattern is thus projected through a projection lens system 111, having a semiconductor substrate 112 exposed thereto. In the illumination system of FIG. 1, the opening of the aperture member 17c is defined in the form of a circle to avoid giving an undisirable pattern-dependent directional bias to a resolution property of the exposure system. Accordingly, if the aperture member 17c is formed with a rectangular opening, the resolution property may suffer a disadvantageous difference between when the principal axis of an employed reticle pattern is oriented in the direction of a reference ordinate or abscissa and when it is inclined or declined at an angle of 45 degrees or 135 degrees. Incidentally, the opening area of the aperture member 17c governs an NA of the illumination system, with a significant influence on the resolution property.

Further, the effective light source has a size thereof defined by a value a that is a ratio of the NA of the projection lens system 111 to the NA of the illumination system, in a selective manner within a range of approx. 0.3 to approx. 0.7 in accordance with the type of an employed reticle pattern. The resolution performance tends to ascend with an increased a value in use of a line-and-space pattern for example, or with a decreased σ value when using a contacthole pattern or the like. Besides an optimum adaptation of the size σ, the effective light source may be adapted in configuration for a desirable resolution performance or specified properties therefor.

Accordingly, the proposed illumination method in the aforesaid Publication employs a ring belt illumination system including a ring-like effective light source which, as shown in FIG. 2, has an aperture member 17D provided with a completely masking central member 177 to define an annular opening 176 therebetween.

In the prior art illumination system shown in FIG. 1, it is necessary for a competent pattern resolution of the reticle 110 to collect significant 0 (zero) and +1 (positive first) or −1 (negative first) degree components of deffracted light. As the line width of the pattern becomes smaller, the diffraction angle θ of significant components of light becomes larger and in due course it exceeds a solid angle of the projection lens system 111, failing to provide a desired pattern resolution.

In the ring belt illumination system using the annular aperture member 17D, however, as shown in FIG. 3, incident light from the effective light source to the reticle 110 has a declined angle with respect to the optical axis, so that rays of 0 degree component and either +1 or −1 degree component of deffracted light at the reticle 110 enter the projection lens system 111, permitting an improved resolution of minute patterns.

Referring to FIG. 4 of the aforesaid Publication there is shown another aperture member (18D in FIG. 4) exhibiting a similar effect to the annular aperture member 17D for the ring band illumination. As shown in FIG. 4, the aperture member 18D has a radius-dependent transmittance achieved by forming an extremely thin film of a light masking material over a transparent substrate.

Further, the aforesaid Publication describes, in addition to the ring belt illumination system, a multipoint illumination system for illuminating at four points to improve a performance of resolution, in particular for projections of vertical and/or horizontal patterns. An adaptive selection of an optimum aperture member to the type of an employed reticle pattern provides an extended margin in the production of semiconductor devices.

FIGS. 5 and 6 show an effective light source having a fly-eye lens employed in the reticle illumination system. FIG. 5 shows a bottom view of the fly-eye lens 16; and FIG. 6, a side view of the lens 16 and a profile of an intensity ditribution of projected light therefrom. The fly-eye lens 16 is constituted as an assembly of a plurality of point light sources or the individual (eye) lenses 161 each respectively giving a centrally located peak of light intensity, so that the assembly provides a discrete distribution of intensity peaks. The fly-eye lens has been deemed and actually handled as a single light source having a uniform light intensity distribution. Simulations show that it is necessary to deal with a fly-eye lens as an assembly of discrete point light sources if the fly-eye lens is "relatively" large in size and the number of individual lenses thereof is as small as several tens or less, but unnecessary if the individual (eye) lenses are "relatively" small in size and so large in number as exceeding several tens. In the latter case, focused images should be free from significant influences such as from the number or locations of the individual lenses, and hence the entirety of the fly-eye lens may be handled as a single light source having a uniform light intensity distribution.

Therefore, in conventional reduction exposure apparatus for producing semiconductor devices, which employ an effective light source having a fly-eye lens of the type that consists of a plurality of possibly size-reduced individual eyes to achieve a uniformly continuous distribution of light intensity, no significant problems have been observed even in situations in which the effective light sources have been a single light source giving a continuous light intensity distribution.

As a result, also in applications of a ring belt illumination system or a multi- or four-point illumination system, it would be expected that no problems would occur in using an effective light source having a fly-eye lens of the described type to achieve a continuous light intensity distribution, in combination with an aperture member placed right after the fly-eye lens while the aperture member is formed with an opening designed to be alike in shape with a conventional one such as shown in the prior art FIG. 2.

In those applications, however, it has been found that the opening so formed in the aperture member provides an insufficient flexiblity to permit the required geometry relationship to the individual eyes of the fly-eye lens, so that in the practice of the deformed-aperture illumination method with the need of a relatively small opening area there arises a significant problem such that the number of individual eyes of the fly-eye lens has to be reduced to effect the required illumination through the opening to a reticle, thus resulting in a difficulty of employing a fly-eye lens of the described type as a light source for providing a continuous or uniform light intensity distribution.

Generally, in a fly-eye lens, a central region in the vicinity of the center of each individual eye has a peak of light intensity. Unless the center of each effective eye is coincident with a central circle of an annular opening formed in a conventional deformed aperture member, even when the shape of the opening is designed to be optimum, a high speed operation of illumination through the opening actually fails to exactly irradiate a reticle, thus failing to achieve a desired resolution performance. Moreover, if the peak of light intensity hits the edge of a circular masking portion of the aperture member, the irradiation onto the reticle becomes uneven, causing a dispersed resolution property within an exposed surface of a semiconductor substrate.

As will be seen, in the conventional exposure system described, the resolution property is variable in dependence on the fixing position of an aperture member and hence a high positioning accuracy of μm order is required for fixation of the aperture member, thus prohibiting use of an automatic machine in place of manual positioning of the aperture member. Further, if an aperture member is employed regardless of the layout of a fly-eye lens, the quantity of light passing the aperture member may be reduced so that the light intensity on an exposed surface may extremely drop, causing a significantly reduced throughput. Furthermore, in the case of an aperture member with a continuous transmittance distribution like that shown in FIG. 4, it is necessary to have a mask film grown under a particular sputtering condition for coating the aperture member through a complex process.

SUMMARY OF THE INVENTION

Accordingly, it is an object of the present invention to provide a reduction exposure apparatus which overcomes the aforesaid problems, with an enhanced resolution performance, a uniform light intensity distribution upon exposure and a facilitated alignment of an aperture member (aperture stop), permitting an improved throughput in production of semiconductor desvices.

In accordance with one aspect of the present invention, there is provided a reduction exposure apparatus comprising: a fly-eye lens having a plurality of individual lens units arranged in parallel for passing light from a light source; a reticle to be illuminated by the light passed through the fly-eye lens so that a pattern of the reticle is focused on a predetermined position using a projection lens system; and an aperture member placed between the fly-eye lens and the reticle, the aperture member having a plurality of openings corresponding to the lens units.

Further, a center of each opening may preferably be substantially coincident with an optical axis of each lens unit of the fly-eye lens. Each opening may preferably has an edge part thereof located in a low intensity area of each light intensity distribution obtained by focusing the light by each lens unit. A light transmittance distribution of the openings may preferably be determined corresponding to the lens units of the fly-eye lens. The lens units of the fly-eye lens may preferably act as isolated light sources of the openings, and a resolution property at a time when each isolated light source illuminates a predetermined reticle pattern may preferably be obtained in order. The openings may preferably be selected for the isolated light sources in the order of resolution properties thereof, whichever is better.

Additionally, the aperture member may preferably have an ideal form thereof determined by a simulation and an actual form thereof determined on the basis of the ideal form and a layout of the fly-eye lens.

In accordance with another aspect of the present invention, there is provided a reduction exposure apparatus comprising: a fly-eye lens having a plurality of individual lens units arranged in parallel for passing light from a light source: a reticle to be illuminated by the light passed through the fly-eye lens so that a pattern of the reticle is focused on a predetermined position using a projection lens system; and an aperture device placed between the fly-eye lens and the reticle, the aperture device including a first aperture member and a second aperture member, the first aperture member having a plurality of openings corresponding to peak positions of light intensity of the lens units, the second aperture member having openings for selectively passing the light passed through the openings of the first aperture member.

Each opening of the first aperture member may preferably include an edge part thereof positioned in a low intensity area of each light intensity distribution obtained by focusing the light by each lens unit.

Further, each opening of the second aperture member may preferably include an edge part thereof positioned in a predetermined area excluding the openings of the first aperture member.

Hence, in the reduction exposure apparatus of the present invention, the aperture member having a plurality of openings corresponding to the lens units of the fly-eye lens is interposed between the fly-eye lens and the reticle. Accordingly, the light passed through the lens units of the fly-eye lens can readily be controlled by adjusting the openings.

Moreover, the positioning of the openings with respect to the lens units can largely be moderated. This moderation of the positioning permits the exposure system to facilitate and simplify the automatic operation and to readily deal with various exposure conditions.

Further, in the reduction exposure apparatus of the present invention, a combination of the first aperture member having a plurality of openings corresponding to the peak positions of the light intensity of the lens units of the fly-eye lens and the second aperture member having a plurality of openings for selectively passing the light passed through the openings of the first aperture member is placed between the fly-eye lens and the reticle. Hence, the light passed through the lens units of the fly-eye lens can be passed by the first aperture member and the light passed through the first aperture member can be selectively passed for lighting by the second aperture member.

BRIEF DESCRIPTION OF THE DRAWINGS

The objects, features and advantages of the present invention will become more apparent from the consideration of the following detailed description, taken in conjunction with the accompanying drawings, in which;

FIG. 8 is an elevational view of an aperture member with respect to a fly-eye lens, used in the reduction exposure apparatus shown in FIG. 7;

FIGS. 9A, 9B, 9C and 9D are vertical cross sectional views of the aperture member and the fly-eye lens shown in FIG. 8 for explaining its light intensity, including light intensity distributions before and after the light from the fly-eye lens passes and has passed through the aperture member;

FIGS. 12 to 14 are elevational views showing a simplified process for designing the form of an aperture member to be used in the reduction exposure apparatus according to the present invention, wherein FIG. 12 shows an ideal aperture member form obtained by a simulation, FIG. 13 the ideal aperture member form overlapped with a fly-eye lens to correct the aperture member form, and FIG. 14 a designed form of the aperture member;

FIG. 17 is an elevational view of the second aperture member shown in FIG. 15.

DESCRIPTION OF THE PREFERRED EMBODIMENTS

Figure 1:
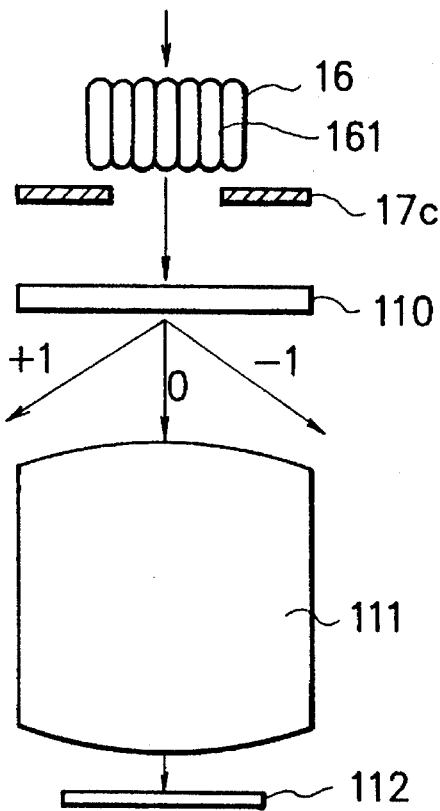
FIG. 1 is a schematic elevational view showing an essential part of a conventional reduction exposure apparatus.
Figure 2:
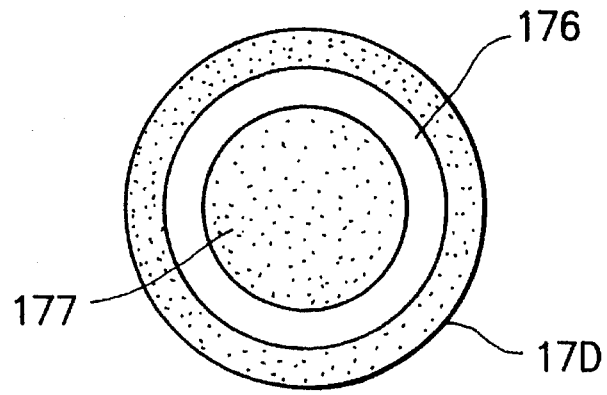
FIG. 2 is a schematic view of an aperture member conventionally used.
Figure 3:
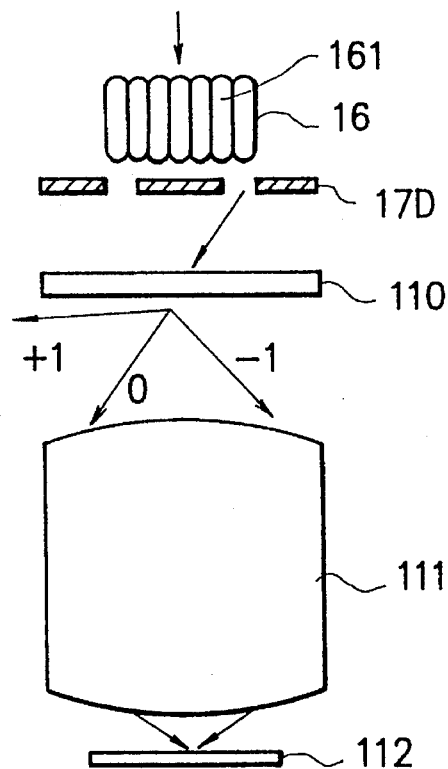
FIG. 3 is a schematic elevational view like FIG. 1 showing the essential part of the conventional reduction exposure apparatus using the aperture member of FIG. 2.
Figure 4:
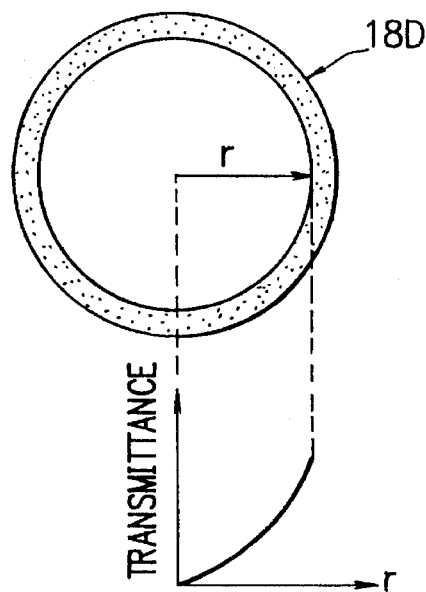
FIG. 4 is a schematic view of another aperture member conventionally used.
Figure 5:
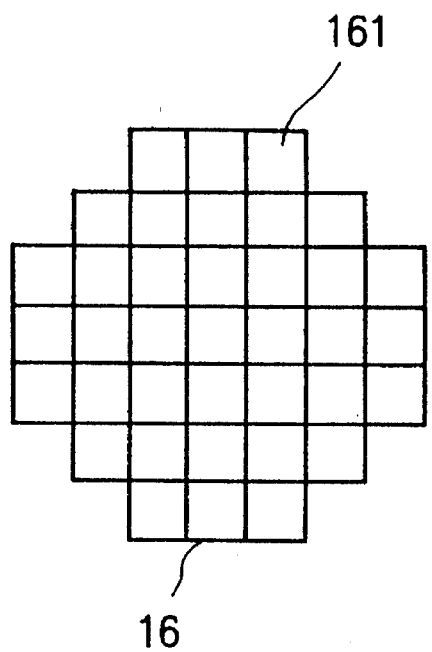
FIG. 5 is a schematic view showing a conventional fly-eye lens.
Figure 6:
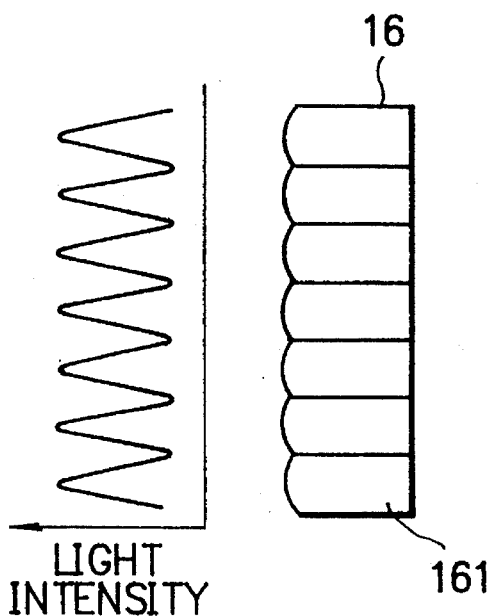
FIG. 6 is a schematic side view of the fly-eye lens shown in FIG. 5 for explaining a distribution of light intensity.

The present invention will now be described in connection with its preferred embodiments with reference to the accompanying drawings, wherein like reference characters designate like or corresponding parts throughtout the views and thus repeated description thereof is omitted for brevity.

Figure 7:
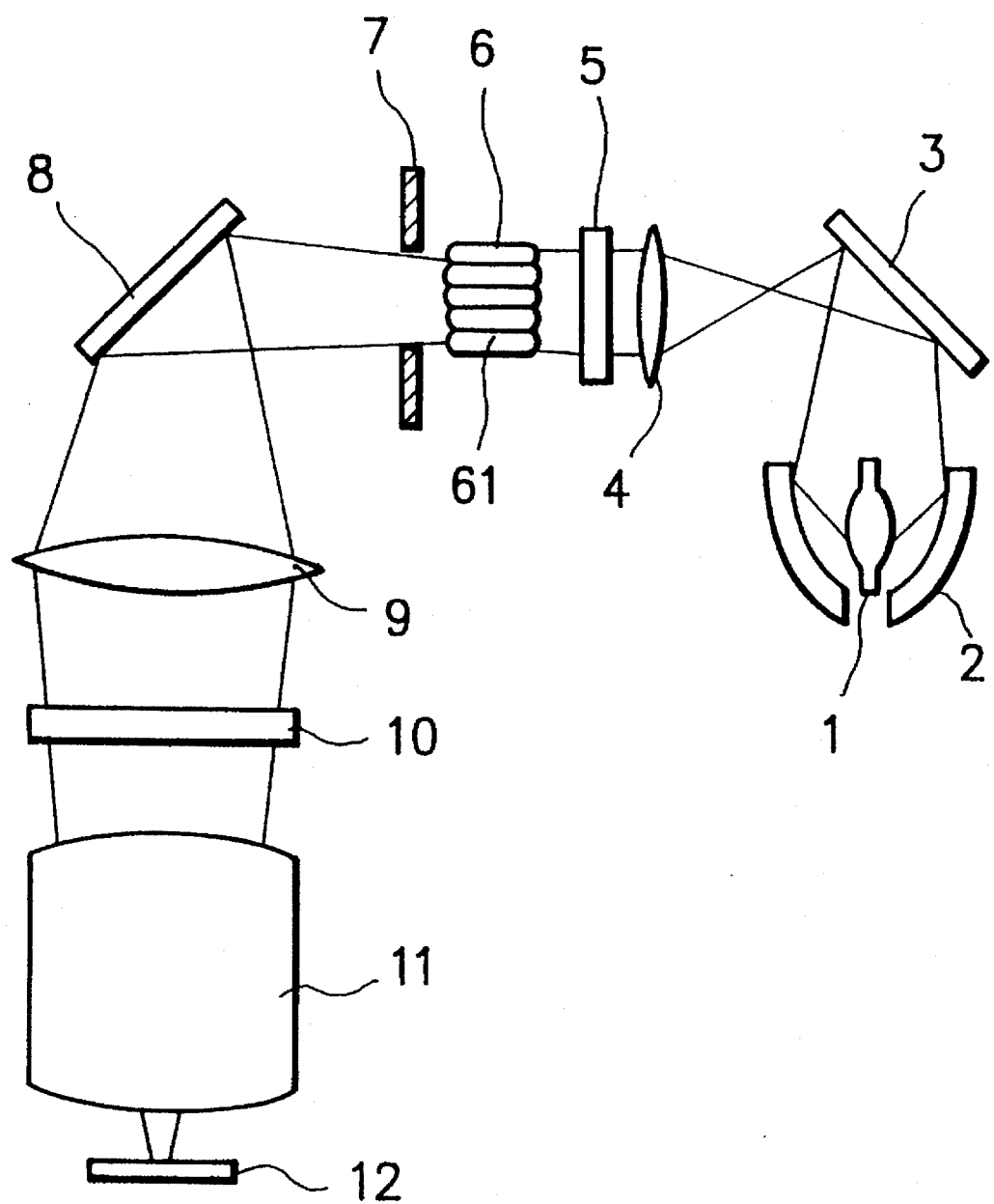
FIG. 7 is a schematic elevational view of a reduction exposure apparatus according to the present invention.

In FIGS. 7 to 14, there is shown a first embodiment of a reduction exposure apparatus according to the present invention. In this embodiment, as shown in FIG. 7, in the reduction exposure apparatus, a super-high pressure mercury lamp 1 as a light source is used and rays of light radiated from the super-high pressure mercury lamp 1 are collected by an oval mirror 2 and are reflected by a cold mirror 3. The reflected light is made parallel by a lens 4 and then is passed through an interference filter 5. In this embodiment, the super-high pressure mercury lamp 1 is designed so as to irradiate g-line (having a wavelength of 436 nm) and i-line (having a wavelength of 365 nm) as the exposure light with high efficiency. In this case, the light having a continuous wavelength is emitted. Hence, while the optical path is changed by the oval mirror 2 and the cold mirror 3, the light (heat rays) having long wavelengths is separated at the same time and only the light having a predetermined wavelength is selected and extracted by the interference filter 5.

Thereafter, the light having the predetermined wavelength is passed through a fly-eye lens 6 so as to obtain a desired uniformity of illumination. Generally, the fly-eye lens 6 is an optical device which is composed of a bundle of several tens of individual lenses or lens units 61 having a square pillar form and the individual lenses 61 by which the light is focused constitute an effective light source. Since the super-high pressure mercury lamp 1 generates the light in a relatively wide region though the coherency of this light is not so high, the light is focused by the individual lenses 61 of the fly-eye lens 6 to raise the coherency and hence each of the lenses 61 turns out to be an independent point light source, That is, considering the imaging characteristic, the influence of the light source form of the super-high pressure mercury lamp 1 disappears and only the form of the point light source group composed of the fly-eye lens 6 can affect. Hence, the point light source group formed by the fly-eye lens 6 is called an effective light source.

Further, right after the fly-eye lens 6, an aperture stop or aperture member 7 is placed for determining the form of the effective light source. This light of the effective light source is passed through a cold mirror 8 and a condenser lens 9 to illuminate a reticle 10. And the light passing through the reticle 10 is imaged on a semiconductor substrate 12 having a resist (photo-sensitive resin) coated thereon by a projection lens system 11.

FIG. 8 shows the aperture member 7 with respect to the fly-eye lens 6 in the reduction exposure apparatus shown in FIG. 7, and FIG. 9 shows its light intensity distribution: that is, the side form of the fly-eye lens 6, the light intensity distribution 96 right after passing through the fly-eye lens 6, the cross section of the aperture member 7 and the light intensity distribution 97 right after the aperture member 7. The aperture member 7 placed right after the fly-eye lens 6 is produced, for example, by processing an aluminum thin plate and treating the processed thin plate with a black chrome plating. This aperture member 7 is designed in consideration of the layout of the single lenses 61 of the fly-eye lens 6 for use in a ring belt illumination system.

That is, the aperture member 7 is wholly prepared in a circular disc form corresponding to the internal diameter of its lens barrel and a plurality of openings 71 for passing the light are provided along its periphery. Hence, the other part functions as a mask part 72. Each opening 71 is composed of a combination of a plurality of square unit openings 73 which correspond to the single lenses 61 of the fly-eye lens 6.

Accordingly, as shown in FIG. 9, the light focused by the individual lenses 61 has a discrete light intensity distribution 96 according to the layout of the fly-eye lens 6 just before the aperture member 7. The openings 71 are designed so that their edge parts 71a may be positioned in low intensity areas of the light intensity distribution 96. As a result, the light output from the individual lenses 61 of the fly-eye lens 6 is selectively passed through the square openings 73 to realize a ring band illumination by the openings 71.

By using this aperture member 7, the openings 71 of the aperture member 7 are positioned so that the square openings 73 constituting the openings 71 correspond to the respective individual lenses 61 of the fly-eye lens 6. Hence, by using the light of the high light intensity areas in the vicinity of the center of each individual lens 61, the illumination of the reticle 10 can be carried out with a desired resolution characteristic according to a simulation concerning resolution characteristic of each opening 71 of the aperture member 7 as described later. Also, a sufficient exposure intensity can be obtained and thus the throughput can be improved.

Further, since the edge parts 71a of the openings 71 are positioned in the low light intensity areas, the edge parts 71a hardly give the influence to the exposure light and the illumination state on the reticle 10 does not turn to be uneven. Moreover, according to this concept, with replacement of the aperture member by another having a different form of opening, the edge parts thereof may be positioned in low light intensity areas of the individual lenses of the fly-eye lens. This design accuracy can be a low value of mm order and hence an automatic exchanger can readily be used for changing the aperture member.

Figure 10:
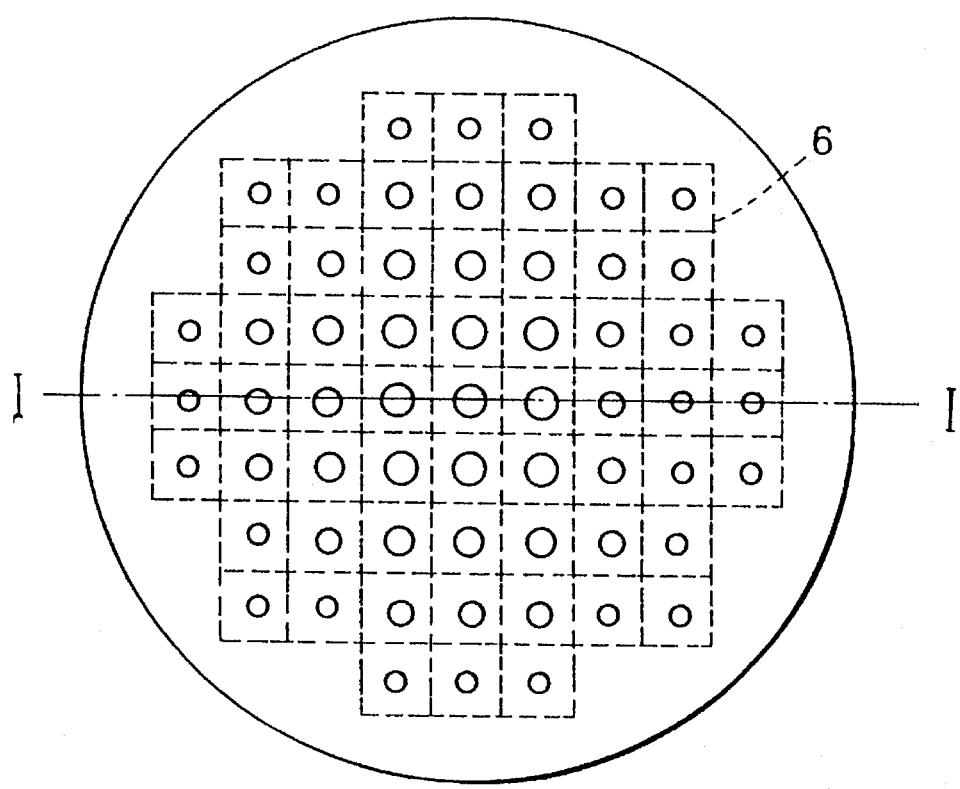
FIG. 10 is a schematic elevational view of the fly-eye lens as a light source model.
Figure 11:
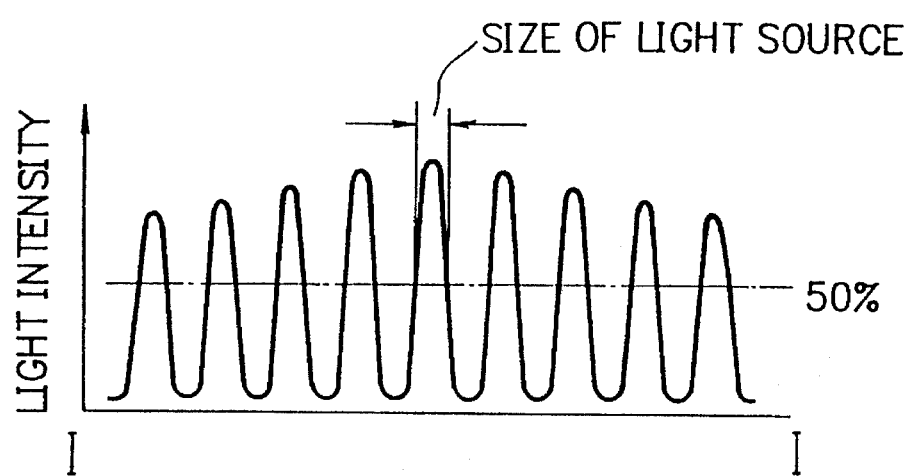
FIG. 11 is a light intensity distribution, taken along the line I—I shown in FIG. 10.

Next, the designing of the openings of the aperture member will now be described in connection with FIGS. 10 and 11. First, as shown in FIG. 10, the whole fly-eye lens 6 is modeled as isolated light sources. The sizes of the light sources in the individual lens positions are obtained from the light intensity distribution just before the aperture member. For example, in FIG. 11, there is shown a light intensity distribution taken along line I—I in FIG. 10 and the sizes of the light sources in the positions of the individual lenses are determined using a slice level of 50% of the entire average light intensity. Then, the resolution property at the time when a desired reticle pattern is illuminated by each light source in an independent manner is determined and the light sources are selected in the order of better resolution property until a predetermined exposure intensity can be obtained. And the form of the aperture member is determined so that the single fly-eye lenses in the positions selected in this manner may be used. At this time, in order to avoid the dependency in the particular pattern direction or directions in the resolution property, the light sources are required to be selected in symmetry about the vertical and horizontal lines.

Figure 12:
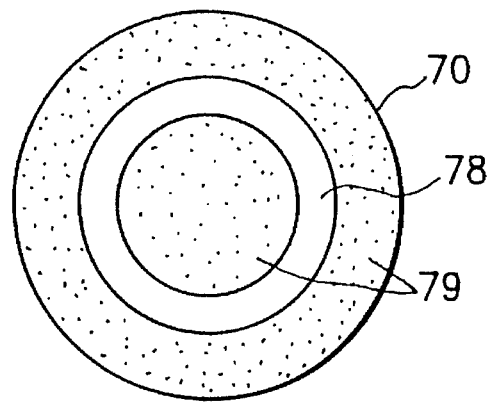
Figure 13:
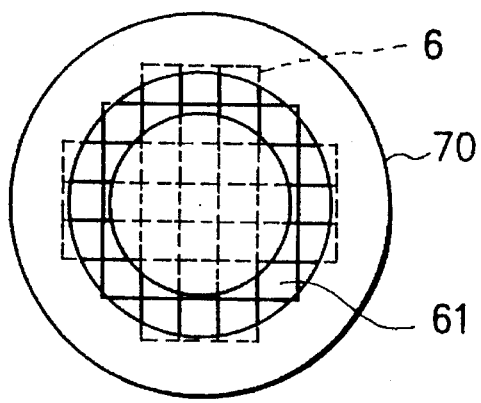
Figure 14:
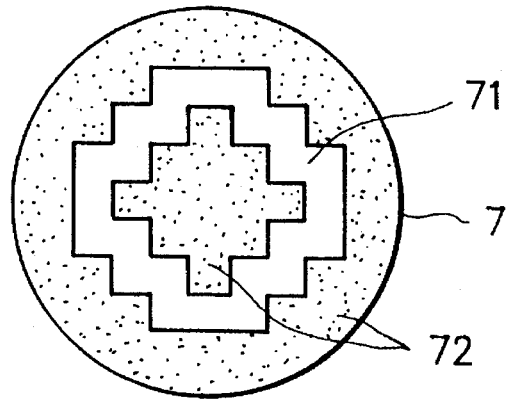

FIGS. 12 to 14 show a simplified process for designing the form of an aperture member to be used in the reduction exposure apparatus according to the present invention. First, as shown in FIG. 12, a form of an ideal aperture member 70 is obtained by a simulation with regard to the layout of the fly-eye lens 6, including an opening pattern or a provisional annular opening 78 defined with a provisional mask 79. Thereafter, as shown in FIG. 13, the ideal aperture member 70 is overlapped with the layout of the fly-eye lens to correct the aperture member form. Then, on the basis of the overlap of the previously obtained ideal effective light source with the layout of the fly-eye lens, certain overlap percentage portions, for instance, at least 40% portions are determined to the openings 71 of the aperture member while the other part is employed as the mask part 72. As a result, the form of the aperture member 7 is determined, as shown in FIG. 14.

In this connection, in this embodiment, when a comparison between an opening 78 in FIG. 12 and an opening 71 in FIG. 14 is executed, it is readily undrstood that in the opening 78 in FIG. 12, only the exposure intensity due to 16 individual lenses 61 of the fly-eye lens 6 is obtained, as apparently understood from FIG. 13, but in turn, in the openings 71 in FIG. 14, the exposure intensity owing to 24 individual lenses 61 can be obtained. As a result, the exposure intensity is improved by 50%.

In the above design method of an aperture member, actually opened windows are selected from the divided windows of the aperture ember 7. Alternatively, the aperture member 7 may be provided with distributed transmittance according to how the divided windows of the aperture member 7 overlap with the fly-eye lens 6. By doing this, a resolution characteristic closer to the simulation is obtained. The aperture member having this transmittance distribution can be prepared by controlling a thickness of a masking material such as chrome to be coated on a transparent substrate of quartz or the like to obtain continuous or stepwise varying transmittance profile. In this case, for example, the surface of the transparent substrate is covered by a mask except transmittance determining portions of the openings are sputtered with a masking material and this sputtering is repeated several times, while the masking area is gradually changed, to readily obtain the openings whose transmittance is varied stepwise.

Figure 15:
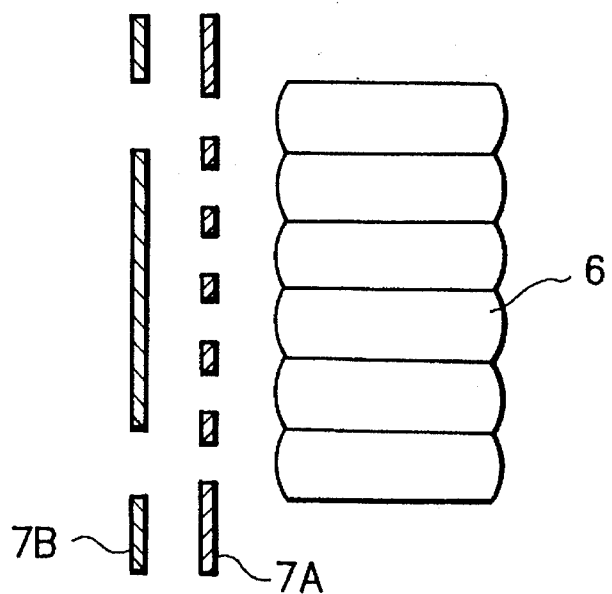
FIG. 15 is a schematic side view showing the fly-eye lens and a first and a second aperture members in a second embodiment of a reduction exposure apparatus according to the present invention.
Figure 16:
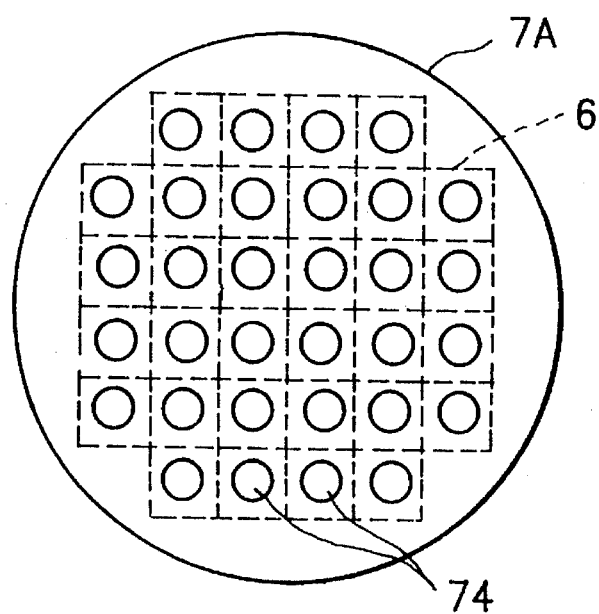
FIG. 16 is an elevational view of the first aperture member shown in FIG. 15.

In FIGS. 15 to 17, there is shown a second embodiment of a reduction exposure apparatus according to the present invention. In this embodiment, as shown in FIG. 15, a first and a second aperture members 7A and 7B are placed right after a fly-eye lens 6. As shown in FIG. 16, the first aperture member 7A includes a plurality of small circular apertures or openings 74 in the positions corresponding to the individual lenses or lense units 61 of the fly-eye lens 6. As shown in FIG. 17, the second aperture member 7B includes four L-shaped apertures or openings 75 for passing the light passed through the small circular openings 74 positioned in four peripheral portions.

In this embodiment, as described above, althought the light intensity distribution of the fly-eye lens 6 itself is discrete, by passing the light output from the individual lenses 61 through the small circular openings 74 of the first aperture member 7A, a completely isolated light intensity can be obtained. Further, the light passed through the small circular openings 74 of the first aperture member 7A is allowed to selectively pass through the L-shaped openings 75 of the second aperture member 7B to obtain a desirable effective light source. Hence, the similar effects to those of the first embodiment can be obtained.

Further, in this embodiment, edge parts 75a of the L-shaped openings 75 of the second aperture member 7B are positioned in certain areas excluding the small circular openings 74 of the first aperture member 7A. Hence, a precise positioning requirement for alignment of the second aperture member 7B does not affect the resolution property and it is sufficient to set the second aperture member 7B with a positioning accuracy of mm order. Hence, in this embodiment, the second aperture member 7B can be implemented of replacement by a compact inexpensive exchanger like a usual slide projector and several tens kinds of aperture members can be automatically changed.

Moreover, in this embodiment, the first and the second aperture members 7A and 7B may preferably be substituted by aperture members having similar configurations thereto and transmittance distribution profiles obtained in the same manner as in the first embodiment, and an optimization to a reticle pattern may be attained. Also, the positions of the first and the second aperture members 7A and 7B can be mutually exchanged with the same effects described above.

As described above, in a reduction exposure apparatus of the present invention, an aperture member having a plurality of openings corresponding to individual lens units of a fly-eye lens is interposed between the fly-eye lens and a reticle and thus characteristics of light passed through the fly-eye lens can readily be controlled by adjusting the openings. Further, the accuracy in the positioning of the openings with respect to the lens units is significantly improved. The improved positioning accuracy permits the exposure system to promote and simplify the automatic operation and to readily deal with various exposure characteristics.

Moreover, in a reduction exposure apparatus of the present invention, by using a combination of two kinds of aperture members, light passed through lens units of a fly-eye lens can selectively be passed and the same effects as described above can be obtained.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A reduction exposure apparatus for illuminating a reticle with a desired resolution characteristic, comprising:

a fly-eye lens having a plurality of individual lens units arranged in parallel for passing light from a light source;

and an aperture stop placed after the fly-eye lens in an optical path of the light and having at least one light-transmissive area for limiting passage of the light, wherein:

edges of said at least one-light-transmissive area are positioned along a boundary between adjacent lens units; and said at least one light-transmissive area substantially comprises selected unit areas each overlapping with one of the lens units so as to provide the exposure system with said desired resolution characteristic.

2. An apparatus as defined in claim 1, wherein said selected unit areas are so selected that a geometry of the entirety of said at least one light-transmissive area is symmetry with respect to both a longitudinal central line and a transverse central line of said unit areas.

3. An apparatus as defined in claim 1, wherein selections of said selected unit areas are based on simulations of resolution characteristic which have been done for each of the lens units by using only a light passed through said each of the lens units.

4. An apparatus as defined in claim 1, wherein each of said at least one light-transmissive area is an opening.

5. An apparatus defined in claim 1, wherein said at least one light-transmissive areas has continuously distributed transmittance.

6. An apparatus as defined in claim 5, wherein a transmittance of each of said selected unit areas in said at least one light-transmissive area is determined on the basis of how said selected unit areas overlap with said fly-eye lens.

7. An apparatus as defined in claim 1, wherein said at least one light-transmissive area has respective transmittances for each of said selected unit areas.

8. A reduction exposure apparatus for illuminating a reticle with a desired resolution characteristic, comprising:

a fly-eye lens having a plurality of individual lens units arranged in parallel for passing light from a light source;

and an aperture stop device placed after the fly-eye lens in an optical path of the light:

a first member having a plurality of circular openings corresponding in a one-to-one fashion to peak positions of light intensity of the individual lens units; and a second aperture member having a plurality of openings for selectively passing the light passed through the openings of the first aperture, wherein:

edges of said plurality of openings are positioned in light-cutting-off areas in said first aperture member; and each of said plurality of openings substantially comprises selected square unit areas which each covers one of said plurality of circular openings so as to provide the exposure system with the desired resolution characteristic.

9. An apparatus as defined in claim 8, wherein said selected unit areas are so selected that a geometry of the entirety of said plurality of openings is symmetry with respect to both a longitudinal central line and a transverse central line of said plurality of circular openings.

* * * * *

UNITED STATES PATENT AND TRADEMARK OFFICE
CERTIFICATE OF CORRECTION

PATENT NO. : 5,619,304
DATED : April 8, 1997
INVENTOR(S) : Tadao Yasuzato

It is certified that error appears in the above-indentified patent and that said Letters Patent is hereby corrected as shown below:

Claim 5, Column 10, Line 14, "areas" should be --area--.

Signed and Sealed this

Twenty-fourth Day of June, 1997

Attest:

BRUCE LEHMAN

*Attesting Officer*  *Commissioner of Patents and Trademarks*